United States Patent [19]
Wong

[11] Patent Number: 5,384,498
[45] Date of Patent: Jan. 24, 1995

[54] DC-COUPLED ACTIVE PULL-DOWN ECL CIRCUIT WITH SELF-ADJUSTING DRIVE CAPABILITY

[75] Inventor: Thomas S. W. Wong, San Jose, Calif.

[73] Assignee: Synergy Semiconductor, Santa Clara, Calif.

[21] Appl. No.: 56,199

[22] Filed: Apr. 30, 1993

[51] Int. Cl.⁶ .......................................... H03K 19/086
[52] U.S. Cl. ........................................ 326/31; 326/91
[58] Field of Search ...................... 307/455, 443, 454

[56] References Cited

U.S. PATENT DOCUMENTS

| | | | |
|---|---|---|---|
| 4,536,665 | 8/1985 | Dayton | 307/443 |
| 5,075,580 | 12/1991 | Dayton et al. | 307/455 |

OTHER PUBLICATIONS

Sedra et al., *Microelectronic Circuits*, Holt, Rinehart, and Winston, 1987, p. 555.

*Primary Examiner*—Edward P. Westin
*Assistant Examiner*—Jon Santamauro
*Attorney, Agent, or Firm*—Flehr, Hohbach, Test, Albritton & Herbert

[57] ABSTRACT

A DC-coupled active pull-down ECL circuit ("LS-APD") has a pull-down drive that self-adjusts to load conditions. A current source sinks emitter current from first and second push-pull transistors. The input signal is coupled to the base of the first transistor, whose inverted collector signal is coupled to the base of a pull-up transistor whose emitter is the LS-APD output voltage node. (A non-inverting configuration provides the input signal to the base of the second transistor.) The pull-up transistor is coupled between the upper rail and the second transistor's collector load resistor. A pull-down transistor has its base coupled to the second transistor's collector, its collector coupled to the LS-APD output node, and its emitter coupled to a node receiving a regulated Vreg voltage. As load capacitance increases, the output voltage takes longer to drop sufficiently to nearly turn-off the pull-down transistor. Thus, the pull-down transistor stays on longer, sinking more current that promotes a more rapid "1" to "0" output voltage transition and providing a self-adjusting drive capability. A voltage regulator that preferably sinks current and is referenced to the upper rail establishes the Vreg reference voltage. The regulator uses a replica of an LS-APD cell to establish and automatically maintain the Vreg level over variations of process deviation, power supply voltage change and temperature change. The voltage regulator circuit establishes a crossover current in each driven LS-APD equal to that present in the replicated cell.

25 Claims, 7 Drawing Sheets

DC-COUPLED ACTIVE PULL-DOWN ECL CIRCUIT WITH SELF-ADJUSTING DRIVE CAPABILITY

FIELD OF THE INVENTION

This invention relates generally to emitter-coupled logic ("ECL") circuits, and more specifically to an active pull-down circuit for ECL.

BACKGROUND OF THE INVENTION

Emitter-coupled logic ("ECL") circuitry has been widely used in the industry for many years. In ECL, a pair of switching transistors operate in push-pull, with their emitters coupled-together to a switching state current source. Because the switching transistors in ECL are always in an active region, on a relative basis ECL changes states rapidly, but dissipates a large amount of power.

Figure 1A:
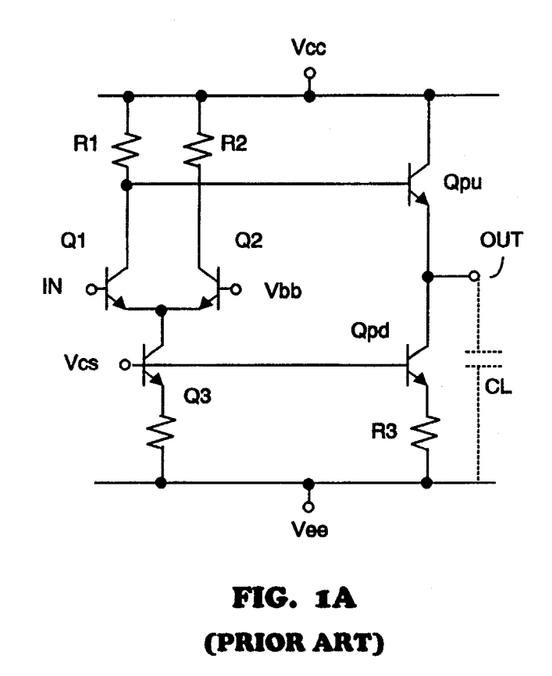
FIG. 1A depicts an emitter coupled logic ("ECL") circuit, according to the prior art.

FIG. 1A depicts a typical ECL circuit, coupled between upper and lower rail power supplies Vcc (typically 0 VDC), Vee (typically −5.2 VDC or −4.5 VDC, depending upon fabrication process) and coupled to receive a switching-current setting voltage Vcs. Vcs is typically about one and one-half emitter-base voltage drops (e.g., about 1.5 VDC) more positive than Vee.

An input signal, typically varying between a "1" level of −0.8 V and a "0" level of −1.6 V, is coupled to the base of transistor Q1, and a Vbb bias voltage of typically—1.2 V is coupled to the base of transistor Q2. Transistor Q3 is biased by a voltage Vcs to act as a current source for transistors Q1 or Q2, which transistors function in push-pull, and to establish a switching state current level that will prevent Q1 and Q2 from saturating. It is noted that voltage signals in ECL circuitry are referenced to ECL ground, which is typically the upper rail power supply Vcc.

When the input voltage is "1", e.g., more positive than Vbb, current flow in Q1 increases and current flow in Q2 decreases in push-pull fashion. The resultant increase in voltage dropped across collector load resistor R1 is coupled to transistor Qpu, and appears as an inverted output voltage signal at the output ("OUT") node. (Of course, the voltage dropped across collector load resistor R2 decreases because of the push-pull configuration of Q1–Q2.) Transistor Qpu functions as an emitter follower, whose emitter load is the current source Qpd and a parallel load capacitance CL (denoted in phantom).

It will be appreciated the ECL circuit of FIG. 1A actively pulls-up the output signal during a "0" to "1" output voltage transition because Qpu's low output impedance permits CL to rapidly charge up to the "1" voltage level. However the ECL circuit of FIG. 1A only passively pulls-down the output during a "1" to "0" output voltage transition because the voltage across CL discharges into Qpd's relatively high output impedance, which prolongs the output voltage transition.

Figure 1B:
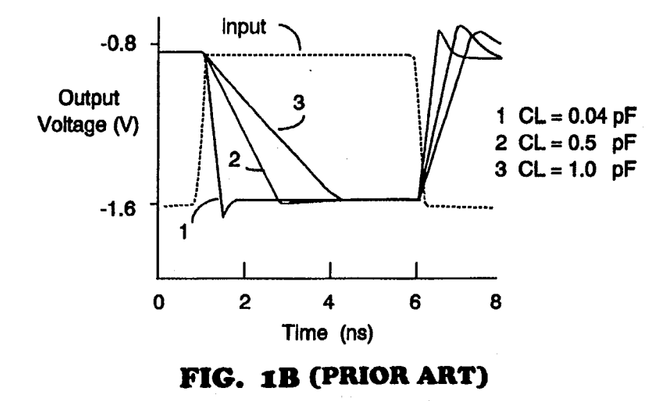
FIG. 1B depicts simulated output voltage for the ECL circuit of FIG. 1A.
Figure 1C:
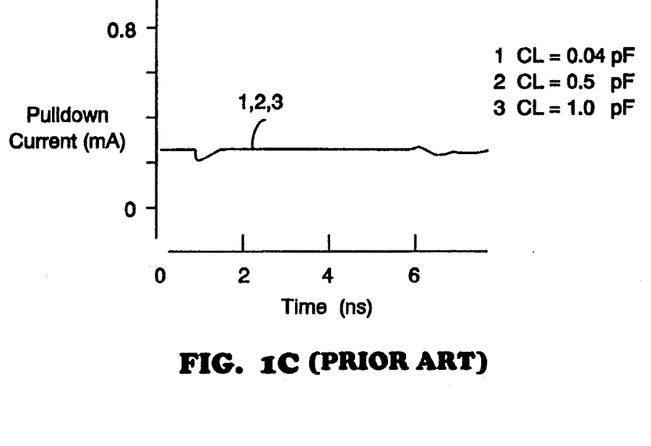
FIG. 1C depicts simulated pull-down current for the ECL circuit of FIG. 1A.

FIG. 1B depicts this "fast pull-up, slow pull-down" output voltage characteristic. In FIG. 1B (as in FIGS. 2B and 3B), the "0" to "1" to "0" state input voltage signal is shown in phantom, and the "1" to "0" to "1" state output voltage signal is shown for various load conditions. It is noted that when CL is small, e.g., 0.04 pF, the output voltage essentially is an inverted version of the input voltage. However, as CL increases to 0.5 pF and then to 1.0 pF, the "1" to "0" output voltage transition takes considerably longer. FIG. 1C depicts the pull-down current through Qpd. As shown, Vcs and R3 establish an essentially steady-state pull-down current of perhaps 250 μA in Qpd, with slight glitches occurring during the output voltage transition times. The basic circuit of FIG. 1A will be referred to herein as "ECL".

Figure 2A:
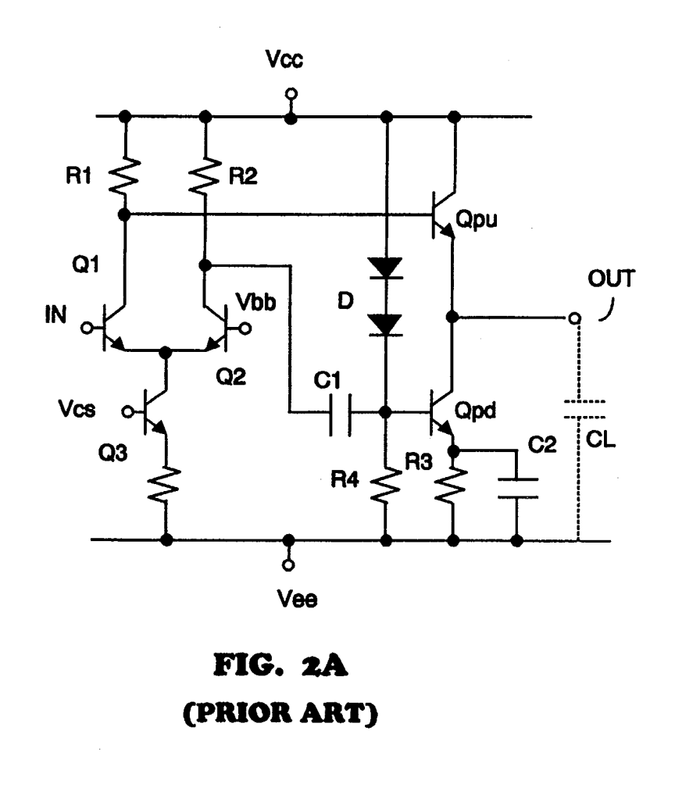
FIG. 2A depicts an AC-coupled active pull-down ("AC-APD") circuit for an ECL circuit, according to the prior art.

FIG. 2A depicts one prior art attempt to improve the pull-down output voltage characteristics of an ECL circuit, wherein Qpd functions as an active pull-down output transistor. In FIG. 2A, Q1, Q2, Q3 and Qpu operate as described above. As the input voltage transitions "0" to "1", the voltage across R2 transitions similarly, which transition is AC-coupled via capacitor C1 to the base of transistor Qpd. The resultant positive-going voltage transient at the base turns-on Qpd, reducing its output impedance, which allows the voltage across load capacitance CL to discharge rapidly through Qpd. The AC-coupled active pull-down ECL configuration of FIG. 2A will be referred to herein as "AC-APD".

Figure 2B:
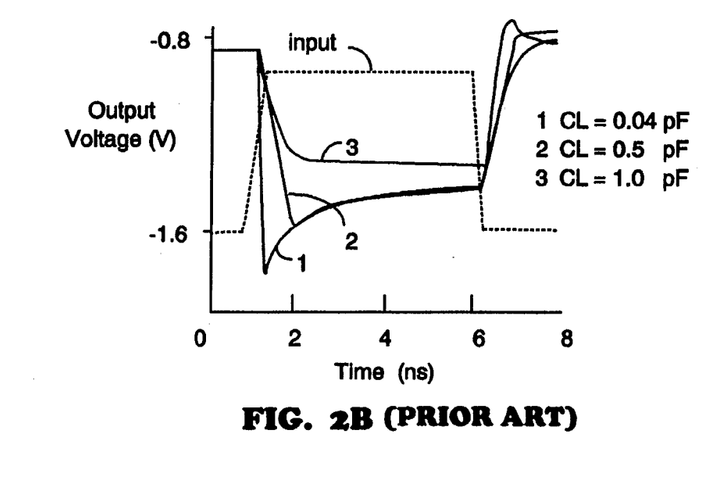
FIG. 2B depicts simulated output voltage for the AC-APD ECL circuit of FIG. 2A.

FIG. 2B depicts the relative improvement afforded by an AC-APD technique, wherein the circuit has been optimized for a load CL=0.5 pF, e.g., $CL_{optimum}=0.5$ pF (e.g., C1=0.2 pF, C2=1 pF). Note the improvement, for example, in the output waveform in FIG. 2B compared to the output waveform of FIG. 1B for the case CL=0.5 pF. However in AC-APD configurations, the values of C1, C2 and R3 are preferably optimized for a specific CL loading condition, as these components determine the dynamic pull-down current in Qpd. Thus, as shown in FIG. 2B, the output waveform is improved for the optimized condition CL=0.5 pF, but not for CL>0.5 pF. Stated differently, for a given AC-APD design, there is a finite range of loadings, outside of which proper circuit operation cannot be ensured. Unfortunately, it is not feasible in practice to fine tune mass-produced AC-APD circuits to various load conditions to achieve a good "1" to "0" output voltage transition.

Figure 2C:
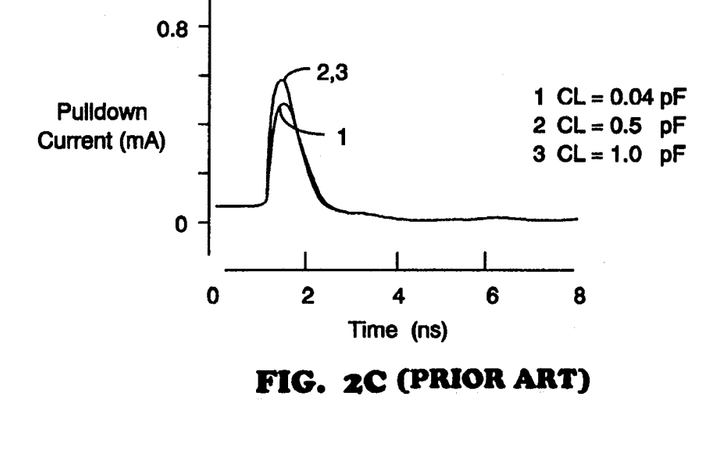
FIG. 2C depicts simulated pull-down current for the AC-APD ECL circuit of FIG. 2A.

FIG. 2C depicts the pull-down current through Qpd for the AC-APD configuration of FIG. 2A, and shows the current transient occurring when the AC-coupled transient turns-on Qpd. For $CL<CL_{optimum}$, the excess pull-down current is consumed as crossover current, resulting in wasteful power dissipation. For $CL>CL_{optimum}$, the initial pull-down transition is fast, followed by a slowly discharging tail, dictated by the steady-state current in Qpd, see voltage waveform 2 in FIG. 2B, for example.

In a gate-array environment where circuit loading uncertainties will exist, a sufficiently large dynamic and steady-state pull-down current should be maintained in an AC-APD macro-cell. Unfortunately, the necessity to maintain such pull-down current dissipates excessive power in the macrocell. Further, having to provide relatively large capacitors C2 (typically in the pF range), and resistors R3 (typically several tens of KΩ) brings a significant chip area penalty and added fabrication process complexity. Understandably, the resultant increase in cell size degrades chip performance and increases interconnection-imposed delays.

What is needed is an ECL-type circuit that provides active output voltage pull-down without significant increase in chip size, process fabrication, or power dissipation. Preferably the pull-down improvement provided by such circuit should be substantially independent of loading conditions. Further, such circuit should provide an output voltage whose falltime may be controlled to be symmetrical to the risetime, thus minimizing timing skew.

The present invention discloses such a circuit.

SUMMARY OF THE PRESENT INVENTION

The present invention provides a DC-coupled active pull-down ECL circuit ("LS-APD") whose pull-down drive self-adjusts to the load conditions presented to the circuit. A switching state current source sinks emitter current though first or second transistors that operate in push-pull fashion. The ECL input voltage signal is coupled to the base of the first transistor, and an input signal that is Vbb or the complement of the ECL input voltage signal is coupled to the base of the second transistor. The inverted signal from the first transistor collector load resistor is coupled to the base of a pull-up transistor, whose emitter voltage is the voltage output signal node for the circuit. (Of course, a non-inverted voltage output signal may be obtained by coupling the ECL input voltage as input to the base of the second transistor, and coupling an input voltage that is Vbb or the complement of the ECL input voltage to the base of the first transistor. of the ECL input voltage signal.)

The pull-up transistor is coupled between the upper rail and the collector load resistor of the second, push-pull, transistor. A pull-down transistor has its base coupled to the collector of the second, push-pull, transistor, its collector coupled to the circuit output node, and its emitter coupled to node receiving a regulated Vreg voltage.

When the input voltage is "0", the pull-up transistor is on, and the output voltage is "1". In this state, the voltage drop across the collector resistor of the second, push-pull, transistor biases the pull-down transistor off, but just at the edge of conduction.

When the input voltage transitions from "0" to "1", collector current increases in the first, push-pull, transistor, and the voltage drop across that transistor's collector resistor biases the pull-up transistor off. However, as the pull-up transistor's collector current decreases, the voltage at the base of the pull-down transistor increases, turning-on the pull-down transistor.

As the pull-down transistor conducts, it permits the circuit output node to rapidly discharge from a "1" to a "0" state. As the output voltage approaches the "0" level, the pull-down transistor turns off, remaining in a near on state because its emitter-base voltage is now just slightly below the forward bias threshold level. In this fashion, the contribution of the pull-down transistor is self-terminating.

Where excessively large load capacitance is present, it will normally take longer for the output voltage level to drop sufficiently to turn-off (e.g., enter a near on state) the pull-down transistor. As a result, the pull-down transistor stays on longer, sinking more current that promotes a more rapid "1" to "0" output voltage transition. Conversely, where a smaller load capacitance is present, the pull-down transistor is on for a shorter time because the output voltage level will transition from "1" to "0" faster. In this manner, the present invention has a self-adjusting drive capability.

A voltage regulator that preferably sinks current and is referenced to the upper rail establishes a regulated Vreg voltage of about two and one-half emitter-base voltage drops, e.g., about −2.3 VDC. The voltage regulator preferably uses a replica of an LS-APD cell to establish and automatically maintain the reference voltage over variations of process deviation, power supply voltage change and temperature change. The voltage regulator circuit further imposes the same crossover current in each driven LS-APD as is present in the replicated cell.

Other features and advantages of the invention will appear from the following description in which the preferred embodiments have been set forth in detail, in conjunction with the accompanying drawings.

DETAILED DESCRIPTION OF THE PREFERRED EMBODIMENT

Figure 3A:
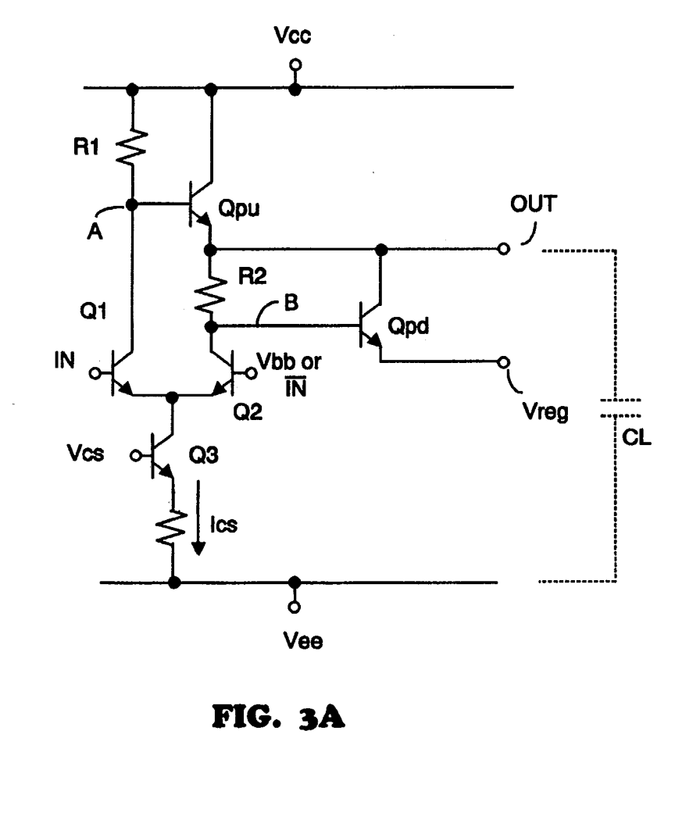
FIG. 3A depicts a DC-coupled, self-adjusting, active pull-down ECL circuit, according to the present invention.

FIG. 3A depicts a DC-coupled (e.g., capacitor-free), self-adjusting, active pull-down ECL circuit, according to the present invention. Hereafter, the configuration of FIG. 3A will be referred to as an "LS-APD", which stands for level-sensing active pull-down circuit.

Transistors Q1 and Q2 function in push-pull fashion as has been described, with transistor Q3 again establishing a maximum switching state current flow Ics for Q1 or Q2. It is noted, however, that while the base of Qpu is coupled to resistor R1, as in the earlier embodiments, the emitter of Qpd is coupled to a regulated voltage port, Vreg.

A voltage regulator circuit (shown in FIG. 7) provides a bias to the Vreg port that causes Qpd to be turned-on when the output voltage transitions from "1" to "0", and to then self-terminate, and remain biased in a nearly off state (e.g., a nearly on state). The preferred value of Vreg should maintain an acceptable noise margin for the circuit of FIG. 3A, while maintaining an acceptable level of crossover current Ix.

In the preferred embodiment, Vreg is about $-2.3$ VDC, a magnitude approximating ("0" $-$Vbe) VDC, where "0" is the low state of the output voltage signal (typically about $-1.6$ VDC), and Vbe is the emitter-base voltage drop for Qpd (typically about 0.7 VDC). Although Vreg$\approx -2.3$ VDC in the preferred embodiment, if an offset voltage were to be introduced between the emitter of Qpd and the Vreg port, for example by including a series-coupled diode, a suitably offset value of Vreg could be used instead.

Although not critical to the present invention, R1 and R2 are sized to permit a collector current in Q1 or Q2 in the range of perhaps 70 $\mu$A to 500 $\mu$A. Transistor Q3 is typically biased to provide a switching state current Ics in the range of perhaps 70 $\mu$A to 250 $\mu$A.

When the voltage input to Q1 is "0" e.g., less than Vbb, current flow in Q1 decreases, and the voltage at node A increases, turning-on Qpu. Thus, when the input voltage is "0", the output voltage will be "1". FIG. 3A depicts the base of Q2 as coupled to Vbb, typically a voltage level approximately halfway between a "0" and a "1" level, $-1.2$ VDC, for example. However, those skilled in the relevant art will recognize that the base of Q2 could instead be coupled to an input signal that is the complement of the signal coupled to the base of Q1. Thus, while the preferred embodiment is described with respect to a single-ended input signal coupled to the base of Q1, it is to be understood that a complementary input signal pair could be used as well.

With Qpu turned-on, the switching state current Ics flows through resistor R2, establishing a voltage drop across R2 that causes transistor Qpd to be nearly turned-off, but to remain at the threshold of conduction. Stated differently, the voltage drop across R2 establishes an emitter-base voltage drop for Qpd that is almost a forward bias for the emitter-base junction of Qpd.

When the input voltage transitions from "0" to "1", the push-pull operation of Q1 and Q2 results in the current flow through Q1 and R1 increasing to Ics. The increased voltage drop across R1 initially causes Qpu to turn-off. At the same time, the current flow through Qpu and R2 decreases, which causes the potential at node B to increase.

As the node B potential increases, transistor Qpd turns on, which results in a large dynamic current to rapidly pull-down the output voltage appearing across CL. Thus, as the input voltage transitions from "0" to "1", the output voltage will rapidly transition from "1" to "0". Significantly, as the output voltage approaches the "0" level, Qpd is once again biased at a near conduction threshold, which provides a self-terminating active pull-down action. More specifically, Qpd self-terminates the pull-down process when the output voltage reaches (Vreg+Vbe), since there will no longer be forward emitter-base bias voltage to drive Qpd.

It will be appreciated from the above that Qpd self-adjusts to the load conditions presented to the present invention. If CL is relatively large, it would normally take longer for the output voltage "1" to "0" transition to drop sufficiently to where Qpd self-terminates. Stated differently, when CL is relatively large, Qpd stays on longer, sinking more current, which pulls down the output voltage from "1" to "0" more quickly. By the same token, when CL is relatively small, the output voltage "1" to "0" transition will normally occur more rapidly, in which case Qpd is turned nearly off, e.g., a nearly on state, sooner, thus sinking less current.

Figure 3B:
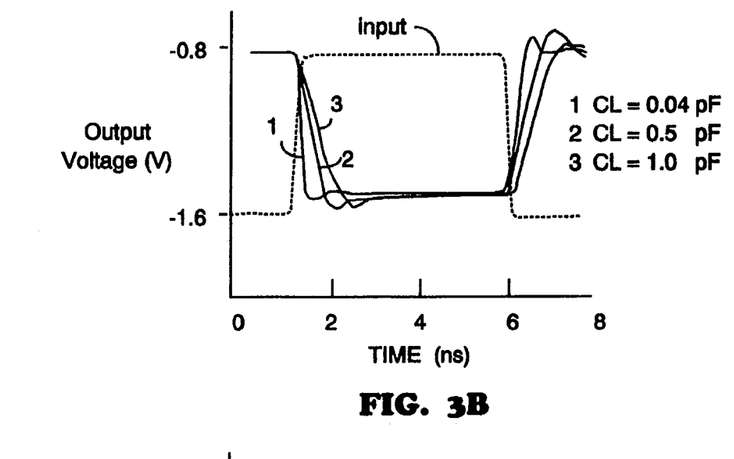
FIG. 3B depicts simulated output voltage for the LS-APD circuit of FIG. 3A.

FIG. 3B demonstrates the improved pull-down characteristics of the output voltage waveform in an LS-APD, according to the present invention. In comparing FIG. 3B with FIGS. 2B and 1B, it will be appreciated that the present invention advantageously provides a large dynamic pull-down current, whose current level is self-adjusting in accordance with the loading conditions. FIG. 3B, for example, depicts an output voltage waveform that is substantially improved despite variations in CL. It is noted that the simulations of FIGS. 3B–6D are based upon a 1.2 $\mu$m double-poly, self-aligned bipolar process technology. It should be understood, however, that the present invention may be practiced with bipolar transistors fabricated according to other processes as well.

Figure 3C:
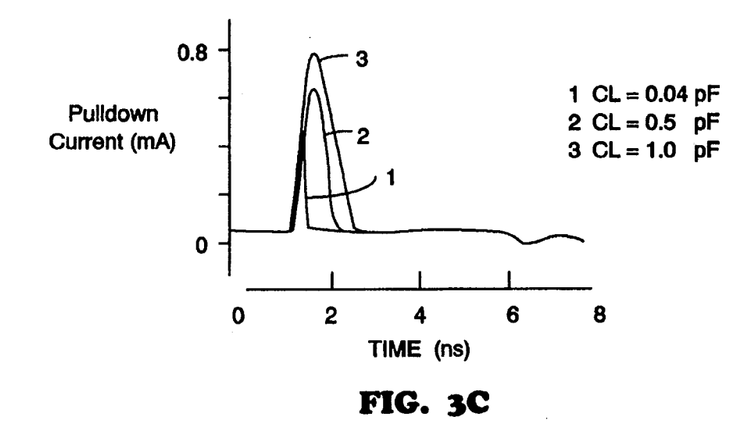
FIG. 3C depicts simulated pull-down current for the LS-APD circuit of FIG. 3A.

In contrast to what was depicted in FIGS. 2C and 1C, FIG. 3C demonstrates that the pull-down current dynamically self-adjusts to the loading condition. A small CL (e.g., waveform 1) causes a relatively short duration, small transient pull-down current, whereas larger values of CL result in the present invention providing a longer duration, larger values of transient pull-down current. This self-adjusting aspect of the invention occurs because larger capacitive loads imply that the output waveform will take longer to drop from "1" to "0", which implies that Qpd will remain on longer. The small steady-state current shown in FIG. 3C represents the quiescent value of Ics.

The result, as shown in FIG. 3B, is an output voltage waveform whose pull-down characteristics are substantially independent of CL. Note that the LS-APD configuration of FIG. 3A can provide an output voltage signal whose "0" to "1" and "1" to "0" transitions are substantially equal. The resultant balanced pull-up and pull-down transition times advantageously minimize signal skewing and error in system-wide applications.

It will further be appreciated that the five transistor, two resistor LS-APD configuration of FIG. 3A can be implemented in the same (or smaller) chip area as the conventional, passive pull-down ECL circuit of FIG. 1A. As a result, there is no required increase in cell size, and no interconnection imposed delay. Further, in contrast to the AC-APD configuration of FIG. 2B, the present invention is capacitor free, and may be fabricated with no additional complexity beyond that required to implement the conventional passive pull-down ECL circuit of FIG. 1A.

As shown in FIG. 3B, the ECL output voltage signal is the complement of the ECL input voltage signal in the above-described embodiment. However, those skilled in the art will appreciate that the configuration of FIG. 3A can provide an output signal that is in phase with an input signal, where the ECL input signal is coupled to the base of Q2. In such configuration, the base of Q1 will be coupled to an input signal that is Vbb or the complement of the ECL input signal coupled to the base of Q2.

Figure 4A:
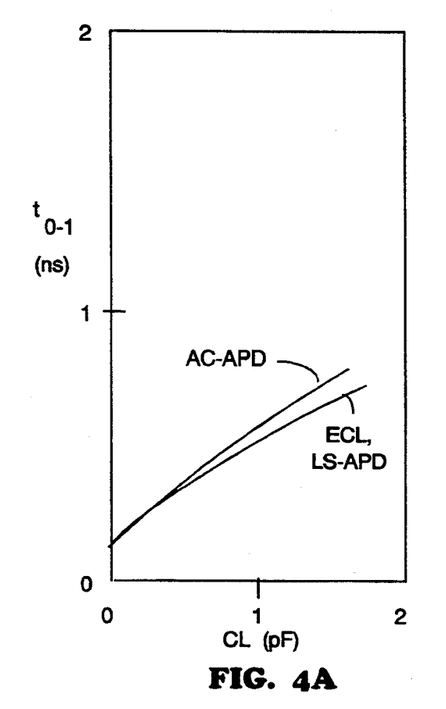
FIG. 4A compares simulated power-delay characteristics for the prior art embodiments of FIGS. 1A, 2A and for the present invention depicted in FIG. 3A during a "0" to "1" output voltage transition.
Figure 4B:
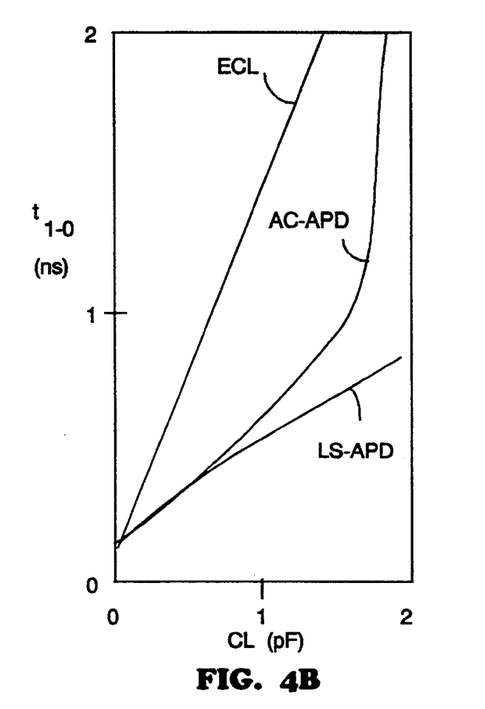
FIG. 4B compares simulated power-delay characteristics for the prior art embodiments of FIGS. 1A, 2A and for the present invention depicted in FIG. 3A during a "1" to "0" output voltage transition.

FIGS. 4A and 4B demonstrate the advantageous power-delay characteristics of the present invention as depicted in FIG. 3A, as compared to the prior art embodiments of FIGS. 1A and 2A. In the simulation, the ECL embodiment dissipates about 2.44 mW/gate, the AC-APD embodiment dissipates about 1.56 mW/gate and is optimized for CL= 0.5 pF (e.g., C1=0.2 pF, C2=1 pF), and the LS-APD embodiment, according to the present invention.

FIG. 4A depicts the delay versus capacitive loading in the various embodiments as the output voltage transitions from "0" to "1". As CL increases, understandably the simulated delay increases for all three embodiments, however for a given capacitive load, the delay for the LS-APD is slightly less than for the prior art embodiments.

FIG. 4B depicts the delay versus capacitive loading in the various embodiments as the output voltage transitions from "1" to "0". Because the "1" to "0" transition represents the more difficult case for the prior art embodiments, the advantage of the present invention is readily apparent from FIG. 4B. Because the AC-APD embodiment has been optimized for a specific load CL=0.5 pF, its performance is similar to that of the present invention, but only for that specific loading condition.

As CL increases beyond 0.5 pF, delay in the prior art embodiments increases substantially when compared to the delay in the present embodiment. Further, it will be appreciated that, unlike the AC-APD embodiment, the LS-APD embodiment provides the superior performance shown in FIGS. 4A and 4B, without requiring optimization to match a specific loading condition.

Figure 4C:
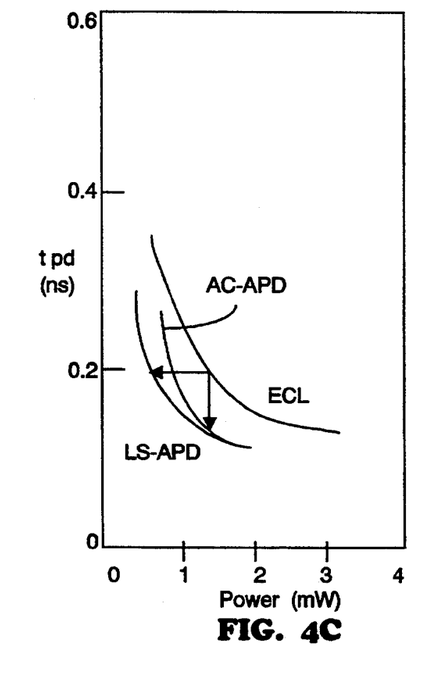
FIG. 4C compares simulated power-delay characteristics for the prior art embodiments of FIGS. 1A, 2A and for the present invention depicted in FIG. 3A, for CL=0.02 pF.
Figure 4D:
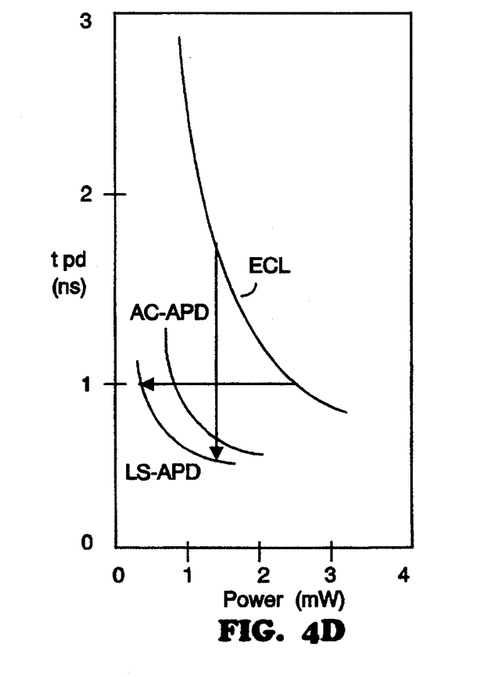
FIG. 4D compares simulated power-delay characteristics for the prior art embodiments of FIGS. 1A, 2A and for the present invention depicted in FIG. 3A, for CL=1 pF.

FIGS. 4C and 4D compare simulated power-delay characteristics for the prior art embodiments of FIGS. 1A, 2A and for the present invention depicted in FIG. 3A, for a fan-out of three. FIG. 4C depicts the case CL=0.02 pF, while FIG. 4D depicts the more heavily loaded case CL=1 pF.

Note in FIG. 4C that for a given 1 ns delay, the prior art ECL configuration dissipates about 1.2 mW/gate, while the LS-APD dissipates only about 44% of this power, e.g., about 0.55 mW/gate. FIG. 4C also demonstrates that for a power dissipation of about 1.2 mW/gate, the ECL configuration has a delay time of about 0.2 ns, whereas the LS-APD configuration has a delay time that is approximately 27% less, namely about 0.15 ns.

FIG. 4D demonstrates that at a dissipation of about 1.4 mW/gate, the prior art ECL configuration has a delay time of 1.75 ns, compared to only 0.5 ns for the LS-APD configuration. Stated differently, at this level of dissipation, the present invention provides a 3.5× speed improvement over the passive ECL configuration. FIG. 4D further demonstrates that at a given 1 ns/gate delay, the present invention dissipates only 0.35 mW/gate compared to 2.5 mW/gate for the passive ECL configuration, a 7.1× power reduction.

Figure 5A:
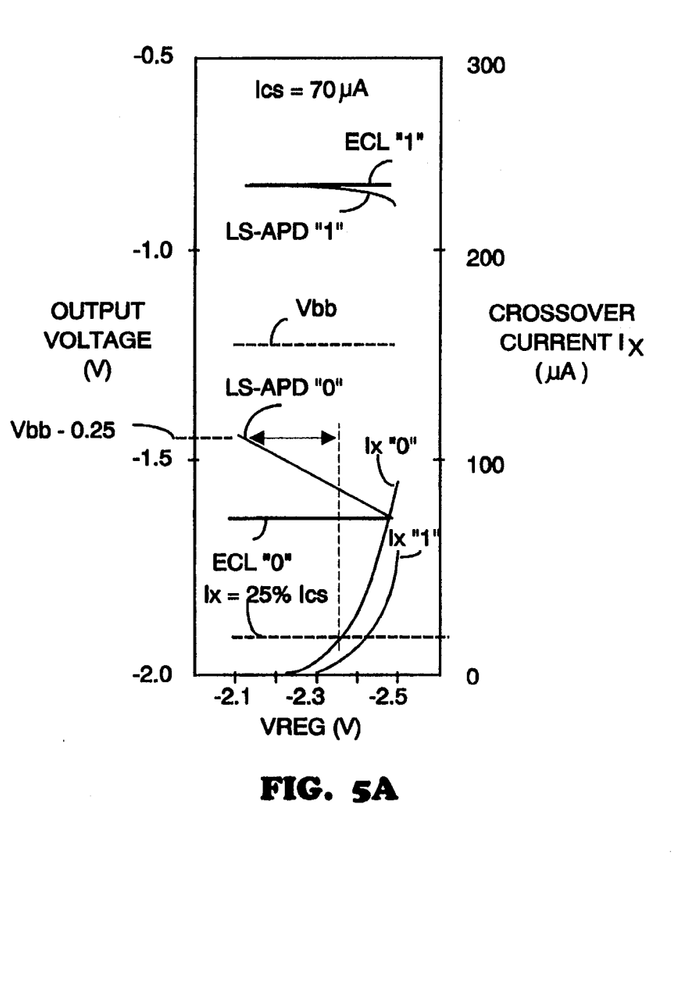
FIG. 5A depicts output voltage and crossover current versus Vreg level for an LS-APD circuit, according to the present invention as contrasted with an ECL at Ics=70 μA.
Figure 5B:
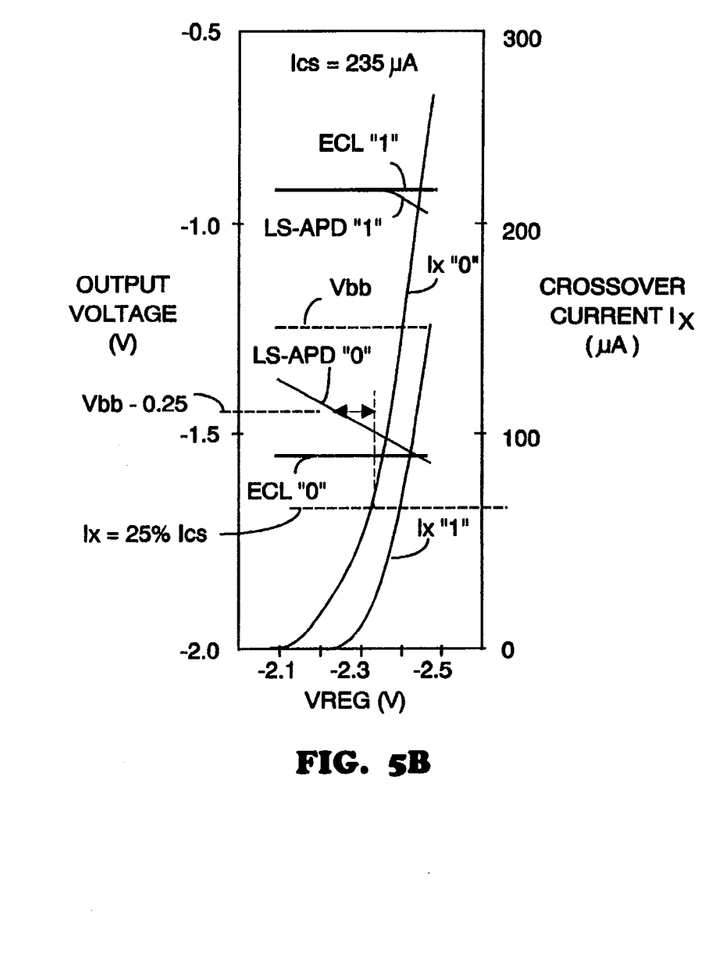
FIG. 5B depicts output voltage and crossover current versus Vreg level for an LS-APD circuit, according to the present invention, as contrasted with an ECL at Ics=235 μA.

FIGS. 5A and 5B depict output voltage and crossover current versus Vreg level for an LS-APD circuit, as contrasted with an ECL at Ics=70 $\mu$A and Ics=235 $\mu$A, respectively. It will be appreciated that, on one hand, FIGS. 5A and 5B demonstrate that as Vreg becomes more negative, the "0" output voltage level provided by the present invention becomes more negative. However, on the other hand, as Vreg becomes more negative, Qpu turns on more, which results in increased crossover current (Ix) flow through Qpu and Qpd.

Good circuit design practice suggests that the noise margin between the output voltage "0" level and Vbb1 (the threshold margin at which an input signal causes a state change) be at least 250 mV, and that crossover current (Ix) be restricted to about 25% of Ics. As shown in FIGS. 5A and 5B, this in turn requires that Vreg be controlled closely to about $-2.3$ VDC.

The uppermost portions of FIGS. 5A and 5B compare the "1" output voltage level for a conventional ECL and for the present invention. The ECL "1" level is flat, which is the ideal case, at about $-0.8$ VDC. Unfortunately, in the present invention, if Vreg is too negative, the crossover current Ix becomes excessive. Thus, with reference to FIG. 3A, it will be appreciated that if the current through Qpu increases excessively, the Qpu base-emitter drop increases, whereupon the "1" output voltage level will begin to decrease. This phenomenon produces the decrease or bending in the LS-APD "1" output voltage level when the crossover current Ix (shown on the right vertical axis) exceeds about 25% of Ics. Since the noise margin between a "1" output voltage level and Vbb1 (shown as about $-1.2$ VDC) must be maintained for reliable performance, the LS-APD should preferably not be operated at Ix>25% Ics. It is understood that Vbb1 is the threshold margin at which an input signal causes a state change.

In the lower portion of these figures, the "0" output level for a conventional ECL is flat, which is the ideal case, at about $-1.6$ VDC. This flat "0" ECL output provides an acceptable noise margin as contrasted with Vbb1, which is about $-1.2$ VDC. However, as noted, as Vreg becomes more negative, so does the "0" voltage output level for the LS-APD. This phenomenon accounts for the linear, downwardly sloping, LS-APD "0" portion of FIGS. 5A and 5B. FIGS. 5A and 5B demonstrate that to maintain at least a 0.25 VDC noise margin between Vbb1 and the LS-APD "0" output voltage state requires that Vreg be controlled at about $-2.3$ VDC. A higher Vreg will unacceptably decrease noise margin for the "0" output state, and a lower, more negative, Vreg will unacceptably decrease noise margin for the "0" output state.

The upwardly curving graphs in FIGS. 5A and 5B depict crossover current (Ix) for the present invention for the "0" and "1" output voltage cases. These curves, which are read against the right-hand vertical axis, show that regardless of the output voltage state, if Vreg is too negative, excessive Ix current rapidly results. Excessive Ix current dissipates power needlessly, and reduces noise margin for the "1" output voltage state.

In summary, FIGS. 5A and 5B suggest that the present circuit should be operated at a current range between 25% of Ics which is where excess current begins, and the region (Vbb1−0.25) VDC, e.g., about −1.45 VDC) which is where noise margin becomes unacceptably small Values of VREG falling within this preferred operating regime are delineated by the double-arrow line appear in each of FIG. 5A and 5B.

As will be described, in a preferred embodiment, a single voltage regulator system provides controlled Vreg and Vregx outputs that are coupled via metal or polysilicon traces to a plurality of LS-APD circuits such as that depicted in FIG. 3A. Preferably the voltage regulator system includes a current sinking transistor for each LS-APD cell, which transistor is located adjacent the cell. The collector of each such transistor is coupled to the Vreg node of each cell, the base is coupled to Vregx, and the emitter is coupled to Vee.

Understandably, LS-APD circuits nearer to the voltage regulator will see a higher Vreg voltage than will more remotely situated LS-APD circuits. The voltage difference between Vreg at the regulator output (the "root" value of Vreg) and Vreg seen by remote or "tip" located LS-APD circuits will be the ohmic voltage drop present in the metal or polysilicon traces.

Figure 6A:
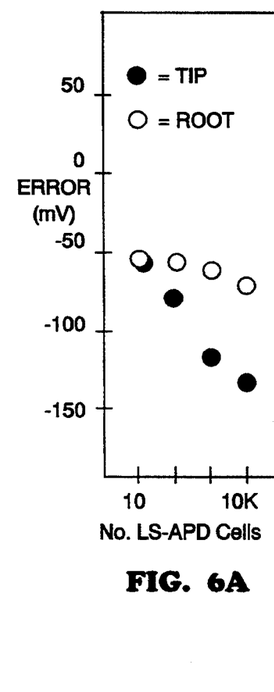
FIG. 6A depicts Vreg voltage regulator tracking error as a function of the number of LS-APD cells, according to the present invention.

FIG. 6A shows the simulated results of DC tracking error for the case Vee=−5.0 VDC, Tj=27° C. (transistor junction temperatures) as the number of LS-APD cells increases. For a small number of cells, the root voltage (depicted as white circles) and the tip cell (depicted as black circles) voltage are essentially the same. Predictably, however, as more cells are added, there is a greater ohmic loss and a greater error between the root and tip values of Vreg. In FIG. 6A, as well as FIGS. 6B and 6C, an 8 mm length, 2 μm wide 16×16 mesh layout is assumed for the various lines carrying Vreg voltage levels. However, even at the tip of the meshed Vreg lines, the tracking error can be controlled within a range of about 150 mV.

Figures 6B, 6C:
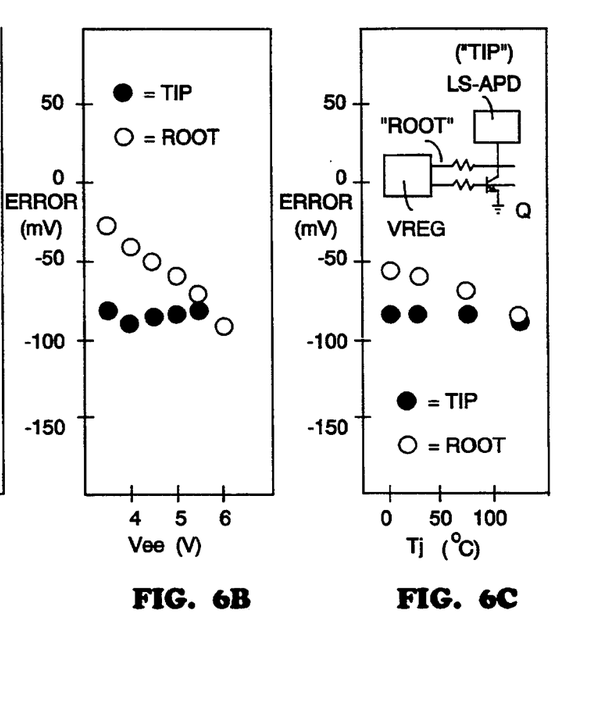
FIG. 6B depicts Vreg voltage regulator tracking error as a function of the Vee power supply, according to the present invention.
FIG. 6C depicts Vreg voltage regulator tracking error as a function of device junction temperature, according to the present invention.

In FIG. 6B, the number of LS-APD cells is 110, Tj=27° C., and Vee is varied. Interestingly, while the error voltage at the tip increases with the number of cells (FIG. 6A), the error is substantially independent of Vee, as depicted in FIG. 6B.

FIG. 6C depicts schematically the Vreg and Vregx line ohmic resistance loss between the voltage regulator ("VREG") and the tip LS-APD cell and its associated current transistor Q. The simulation in FIG. 6C assumes 20 Ω resistance in the conductive traces, Vee=−5 VDC, and 110 LS-APD circuits. It will be appreciated from FIG. 6C that the error voltage at the tip is substantially independent of the Tj temperature.

Figure 6D:
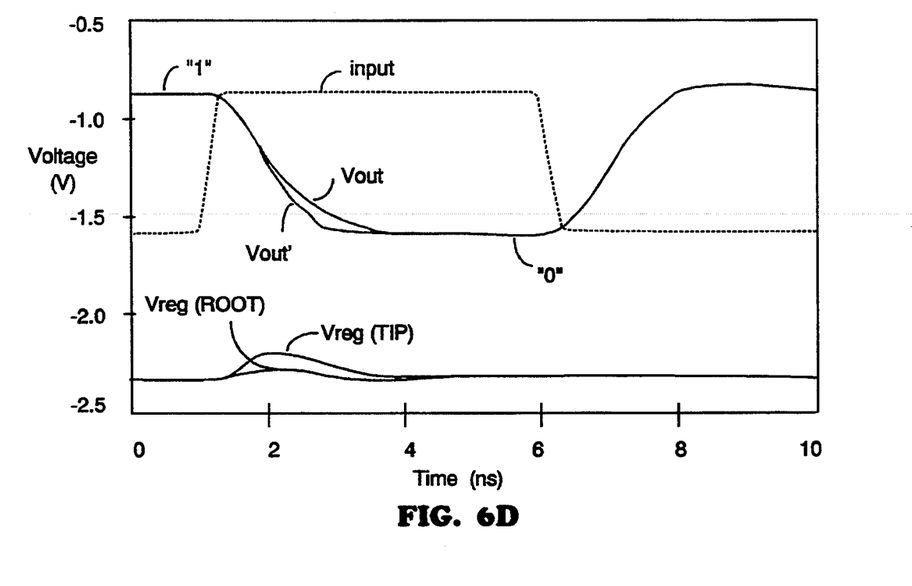
FIG. 6D represents transient response of the present invention, when simultaneously switching 100 out of 1100 cells, according to the present invention.

FIG. 6D depicts the simulated transient response for an integrated circuit wafer that includes a plurality of LS-APD cells, wherein 100 cells out of 1100 cells are switching simultaneously. As shown, the voltage transient to Vreg seen at the tip is more pronounced than what is seen at the root. This finding is not surprising in that distributed resistance and capacitance is encountered at the tip. A small amount of so-called ground bounce noise is observed at the Vreg lines. However this ground bounce noise does not affect the "0" output voltage level of steady-state, quiescent, cells, nor does it degrade switching speed.

Figure 7:
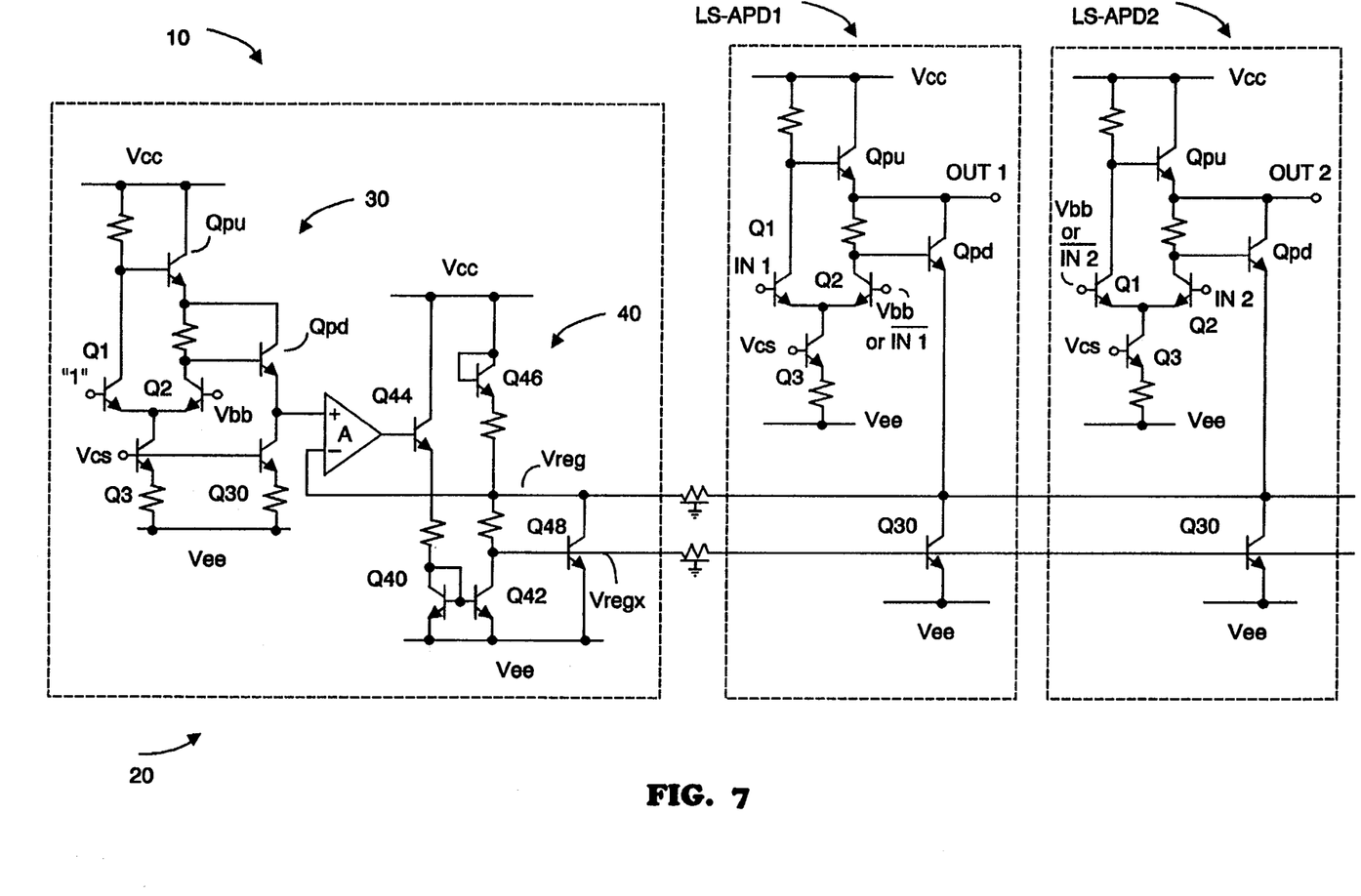
FIG. 7 depicts a schematic of a preferred embodiment of a Vreg voltage regulator, used with several LS-APD cells, according to the present invention.

FIG. 7 depicts symbolically a wafer 10 whereon a Vreg voltage regulator 20 and several LS-APD cells are fabricated according to the present invention. While FIG. 7 depicts two LS-APD cells, namely LS-APD1 and LS-APD2, in practice there can be many such cells, for example several hundred cells. Note in FIG. 7 that LS-APD1 is implemented to provide an output signal OUT1 that is the complement of the IN1 signal, whereas LS-APD2 is shown implemented to provide an output signal OUT2 that is in phase with LS-APD2's input signal IN 2. Of course, all of the LS-APD cells could be implemented identiically. In FIG. 7, LS-APD2 would be deemed the "tip" cell as it is most remote from the Vreg source 20.

In the preferred embodiment, voltage regulator 20 includes a replica of a LS-APD cell 20 (namely Q1, Q2, Q3, Qpu as well as a current source transistor Q30, and associated resistors), a differential amplifier A, and a current mirror circuit 40. Cell 20 emulates an LS-APD cell such as those driven by the voltage regulator 20. This emulation permits the voltage regulator circuit to automatically adjust the Vreg output level over variations of process deviation, power supply voltage change and temperature change. Further, the voltage regulator circuit forces the crossover current Ix in each driven LS-APD cell to track the crossover current in the replica cell 20. The voltage regulator 20 also provides a Vregx output voltage, for use by local current sources coupled to each driven LS-APD cell. As noted, in the preferred embodiment the voltage regulator sinks current and is referenced to the upper power supply rail, Vcc.

Within the replica cell 20, the input to Q1 is tied to the "1" voltage level, which causes Qpu to turn off, and Qpd to initially turn-on. The voltage level at the emitter of Qpu will be a "0" (e.g., about −1.6 VDC), and the voltage at the emitter of Qpd will be about one emitter-base diode drop (0.7 VDC) lower, or about −2.3 VDC. In addition to providing an output Vreg signal, the voltage regulator preferably also outputs a Vregx signal that ideally tracks Vcs and generates the desired crossover current Ix in transistors Q30 for each LS-APD cell. Vregx is approximately one emitter-base voltage drop more positive than the lower power supply rail, Vee.

The −2.3 VDC voltage from the replica cell 30 is coupled to the positive input of a differential amplifier A, which forms an ECL comparator with the replica LS-APD cell 30. The negative input of amplifier A is coupled to the Vreg port of the various LS-APD cells, e.g., LS-APD1, LS-APD2, etc.. The negative feedback configuration forces the voltage signals at the positive and negative inputs of amplifier A to be equal, which ensures that Vreg will be about −2.3 VDC and will track the replica LS-APD cell 30. Amplifier A may be implemented conventionally, and preferably is compensated against oscillation by bandwidth limiting to preserve a 90° phase margin.

Voltage regulator 20 also provides an output voltage level Vregx, that drives the various current sources Q30 associated with each driven LS-APD cell. Those skilled in the art will recognize that circuit 40 (comprising transistors Q40, Q42, Q44, Q46) is a current mirror that establishes a reference crossover current Ix in transistor Q48. More specifically, the various LS-APD cells (e.g., LS-APD1, LS-APD2, etc.) coupled to the voltage regulator will have the same crossover current Ix as is present in the replicated cell. The crossover current Ix is determined from data such as was described with reference to FIGS. 5A and 5B.

The voltage regulator 20 may be implemented in the input/output slot of an integrated circuit wafer 10, from which slot Vreg, Vregx lines are provided to LS-APD cells on the wafer. However, parasitic resistance along the Vreg, Vregx lines can produce significant voltage drops when large dynamic pull-down current from all of the LS-APD cells is concentrated in one voltage regulator. Although the Vreg, Vregx lines could be made wider to reduce the ohmic loss, line widening brings associated chip area penalty and imposes restrictions of the integrated circuit layout.

A preferred embodiment, as shown in FIG. 7, locates a local current source Q30 in each driven LS-APD cell, for example LS-APD1 and LS-APD2. Providing local current sources advantageously distributes the pull-down current across the wafer. Further, parasitic capacitance between the Vreg and Vregx lines actually improves the transient response of the local current sources Q30. In essence, in addition to providing additional pull-down transient current, transistors Q30 act like active capacitors.

While FIG. 7 depicts an individual local current source Q30 associated with each driven LS-APD cell, it will be appreciated that the current sources Q30 need not be implemented adjacent the associated LS-APD cell. Further, where distribution of pull-down current is not a problem, a single current source could be used instead, or some intermediate number of current sources could be used, to sink current from the driven LS-APD cells.

Modifications and variations may be made to the disclosed embodiments without departing from the subject and spirit of the invention as defined by the following claims. While the preferred embodiment is shown implemented with bipolar transistors, digital circuits implemented in other than ECL may also benefit from the present invention. For example, an active pull-down according to the present invention may be used with switching circuits implemented with field effect transistors.

What is claimed is:

1. A DC-coupled switching circuit, comprising:
    first and second transistors coupled between an upper rail voltage and a lower rail voltage, each said first and second transistor having an emitter coupled to a common emitter node;
    said first transistor having an input lead coupled to receive a first input signal, and said second transistor having an input lead coupled to receive a second input signal;
    a current source, coupled to said common emitter node, said current source sinking output current through one of said first or said second transistor to said lower rail voltage;
    a pull-up transistor having an input lead coupled to receive an inverted input signal from said first transistor, having a first output lead coupled to said upper rail voltage and having a second output lead resistively coupled to an output lead of said second transistor;
    said second output lead of said pull-up transistor providing a signal output port for said circuit; and
    a pull-down transistor having an input lead coupled to said output lead of said second transistor, having a first output lead coupled to said signal output port, and having a second output lead coupled to a Vreg reference port receiving a Vreg reference voltage;
    said Vreg reference voltage having a magnitude causing said pull-down transistor to turn-on when a signal at said signal output port transitions from logic state "1" to logic state "0" and then to self-terminate and remain biased in a near on state;
    wherein operation of said pull-down transistor self-adjusts to a load coupled to said signal output port, affecting transition time of a logic state "1" to logic state "0" signal output node transition.

2. The circuit of claim 1, wherein each said transistor is a bipolar transistor, each said first input lead is a base lead, each said first output lead is a collector lead and each said second output lead is an emitter lead.

3. The circuit of claim 1, wherein a chosen one of said first and second input signals is an ECL input signal to said circuit, and an unchosen one of said first and second input signals is selected from the group consisting of (i) a threshold bias intermediate to "0" and "1" logic state voltage signal levels, and (ii) a signal that is complementary to said ECL input signal.

4. The circuit of claim 2, wherein said Vreg reference voltage is about one emitter-base diode drop more negative than a "0" level signal for said circuit.

5. The circuit of claim 1, further including voltage regulator means for providing said Vreg reference voltage, said voltage regulator means being referenced to said upper rail voltage and providing current sinking.

6. The circuit of claim 1,
    further including voltage regulator means for providing said Vref reference voltage to said Vreg reference port, comprising:
    third and fourth transistors coupled between said upper rail voltage and said lower rail voltage, each said third and fourth transistor having an emitter coupled to a common reference emitter node;
    a chosen one of said third and fourth transistors having an input lead coupled to receive a DC logic "1" voltage level, the unchosen one of said third and fourth transistors having an input lead coupled to receive a DC threshold voltage level intermediate to a logic "1" and a logic "0" level;
    a fifth transistor having an input lead coupled to receive an inverted input signal from said third transistor, having a first output lead coupled to said upper rail voltage and having a second output lead resistively coupled to an output lead of said fourth transistor;
    a sixth transistor having an input lead coupled to said first output lead of said fourth transistor, having a first output lead coupled to said second output lead of said fifth transistor, and having a second output lead functioning as a regulated voltage output port;
    current means for providing first and second current sinking paths, said first sinking path coupled between said common reference emitter node and said lower rail voltage, and said second sinking path coupled between said voltage regulated output port and said lower rail voltage, said first sinking path sinking output current through one of said third or said fourth transistor to said lower rail voltage and said second sinking path sinking current from said sixth transistor to said lower rail voltage;
    wherein said voltage regulator means creates a voltage bias at said voltage regulated output port that is a desired said Vreg reference potential at a desired crossover current bias level; and
    feedback means for comparing a potential present at said Vreg port in said DC-coupled switching circuit with said voltage bias present at said voltage regulated output port, and for forcing said potential at said Vreg reference port to be substantially equal to said voltage bias at said voltage regulated output port.

7. The circuit of claim 6, wherein said feedback means includes a differential amplifier, having a first input coupled to said regulated voltage output port of said sixth transistor, having a second input coupled to said Vreg reference port, and providing an output signal proportional to a difference between signals present at said first and said second input, and a current mirroring circuit coupled between said upper rail voltage and said lower rail voltage, said current mirror circuit having an input port coupled to said output signal from said differential amplifier, and further having a node whereat a Vreg voltage coupled to said Vreg reference port is present, wherein said crossover current bias level in said voltage regulator means is imposed on said DC-coupled switching circuit.

8. The circuit of claim 1, further including voltage regulator means for providing said Vreg reference voltage, said voltage regulator means being referenced to said upper rail voltage and providing current sinking, wherein said voltage regulator means includes a current source transistor, coupled between said Vreg reference port on said DC-coupled switching circuit and said lower rail voltage;

said current source transistor receiving a reference bias voltage from said voltage regulator means and being disposed at a location selected from the group consisting of (i) adjacent said voltage regulator means, and (ii) adjacent said DC-coupled switching circuit.

9. A DC-coupled emitter-coupled logic ("ECL") switching circuit, comprising:

first and second bipolar transistors coupled between an upper rail voltage and a lower rail voltage, each said first and second transistor having an emitter coupled to a common emitter node;

said first transistor having a base lead coupled to receive a first input signal, and a collector lead coupled to said upper rail voltage, and said second transistor having a base lead coupled to receive a second input signal, and a collector lead coupled to said upper rail voltage;

a current source, coupled to said common emitter node, said current source sinking emitter current through one of said first or said second transistor to said lower rail voltage;

a pull-up transistor having a base lead coupled to receive a collector signal from said first transistor, having a collector lead coupled to said upper rail voltage and having an emitter lead resistively coupled to said collector of said second transistor;

said emitter lead of said pull-up transistor providing a signal output port for said circuit; and a pull-down transistor having a base lead coupled to said collector of said second transistor, having a collector lead coupled to said signal output port, and having an emitter lead coupled to a Vreg reference port receiving a Vreg reference voltage;

said Vreg reference voltage having a magnitude causing said pull-down transistor to turn-on when a signal at said signal output port transitions from logic state "1" to logic state "0" and then to self-terminate and remain biased in a near on state;

wherein operation of said pull-down transistor self-adjusts to a load coupled to said signal output port, affecting transition time of a logic state "1" to logic state "0" signal output node transition.

10. The circuit of claim 9, wherein a chosen one of said first and second input signals is an ECL input signal to said circuit, and an unchosen one of said first and second input signals is selected from the group consisting of (i) a threshold bias intermediate to "0" and "1" logic state voltage signal levels, and (ii) a signal that is complementary to said ECL input signal.

11. The circuit of claim 9, wherein said Vreg reference voltage is about one emitter-base diode drop more negative than a "0" level signal for said circuit.

12. The circuit of claim 9, further including voltage regulator means for providing said Vreg reference voltage, said voltage regulator means being referenced to said upper rail voltage and providing current sinking.

13. The circuit of claim 9, further including voltage regulator means for providing said Vref reference voltage to said Vreg reference port, comprising:

third and fourth transistors coupled between said upper rail voltage and said lower rail voltage, each said third and fourth transistor having an emitter coupled to a common reference emitter node;

a chosen one of said third and fourth transistors having an input lead coupled to receive a DC logic "1" voltage level, the unchosen one of said third and fourth transistors having an input lead coupled to receive a DC threshold voltage level intermediate to a logic "1" and a logic "0" level;

a fifth transistor having an input lead coupled to receive an inverted input signal from said third transistor, having a first output lead coupled to said upper rail voltage and having a second output lead resistively coupled to an output lead of said fourth transistor;

a sixth transistor having an input lead coupled to said first output lead of said fourth transistor, having a first output lead coupled to said second output lead of said fifth transistor, and having a second output lead functioning as a regulated voltage output port;

current means for providing first and second current sinking paths, said first sinking path coupled between said common reference emitter node and said lower rail voltage, and said second sinking path coupled between said voltage regulated output port and said lower rail voltage, said first sinking path sinking output current through one of said third or said fourth transistor to said lower rail voltage and said second sinking path sinking current from said sixth transistor to said lower rail voltage;

wherein said voltage regulator means creates a voltage bias at said voltage regulated output port that is a desired said Vreg reference potential at a desired crossover current bias level; and feedback means for comparing a potential present at said Vreg port in said DC-coupled switching circuit with said voltage bias present at said voltage regulated output port, and for forcing said potential at said Vreg reference port to be substantially equal to said voltage bias at said voltage regulated output port.

14. The circuit of claim 13, wherein said feedback means includes a differential amplifier, having a first input coupled to said regulated voltage output port of said sixth transistor, having a second input coupled to said Vreg reference port, and providing an output signal proportional to a difference between signals present at said first and said second input, and a current mirroring circuit coupled between said upper rail voltage and said lower rail voltage, said current mirror circuit having an input port coupled to said output signal from said differential amplifier, and further having a node whereat a Vreg voltage coupled to said Vreg reference port is present, wherein said crossover current bias level in said voltage regulator means is imposed on said DC-coupled switching circuit.

15. The circuit of claim 9, further including voltage regulator means for providing said Vreg reference voltage, said voltage regulator means being referenced to said upper rail voltage and providing current sinking, wherein said voltage regulator means includes a current source transistor, coupled between said Vreg reference port on said DC-coupled switching circuit and said lower rail voltage;
 said current source transistor receiving a reference bias voltage from said voltage regulator means and being disposed at a location selected from the group consisting of (i) adjacent said voltage regulator means, and (ii) adjacent said DC-coupled circuit.

16. A DC-coupled integrated circuit comprising:
 at least two emitter-coupled logic ("ECL") switching circuits each of which includes:
  first and second bipolar transistors coupled between an upper rail voltage and a lower rail voltage, each said first and second transistor having an emitter coupled to a common emitter node;
  said first transistor having a base lead coupled to receive a first input signal, and a collector lead coupled to said upper rail voltage, and said second transistor having a base lead coupled to receive a second input signal, and a collector lead coupled to said upper rail voltage;
  a current source, coupled to said common emitter node, said current source sinking emitter current through one of said first or said second transistor to said lower rail voltage;
  a pull-up transistor having a base lead coupled to receive a collector signal from said first transistor, having a collector lead coupled to said upper rail voltage and having an emitter lead resistively coupled to said collector of said second transistor;
   said emitter lead of said pull-up transistor providing a signal output port for said circuit;
  a pull-down transistor having a base lead coupled to said collector of said second transistor, having a collector lead coupled to said signal output port, and having an emitter lead coupled to a Vreg reference port receiving a Vreg reference voltage;
   said Vreg reference voltage having a magnitude causing said pull-down transistor to turn-on when a signal at a said signal output port transitions from logic state "1" to logic state "0" and then to self-terminate and remain biased in a near on state; and
 voltage regulator means for providing said Vreg reference voltage, said voltage regulator means being referenced to said upper rail voltage and providing current sinking;
  wherein operation of a said pull-down transistor self-adjusts to a load coupled to a said signal output port, affecting transition time of a logic state "1" to logic state "0" signal output node transition.

17. The integrated circuit of claim 16, wherein chosen ones of said first and second input signals are ECL input signal to said circuit, and unchosen ones of said first and second input signals are selected from the group consisting of (i) a threshold bias intermediate to "0" and "1" logic state voltage signal levels, and (ii) a signal that is complementary to said ECL input signal.

18. The integrated circuit of claim 16, wherein said Vreg reference voltage is about one emitter-base diode drop more negative than a "0" logic level signal for said circuit.

19. The integrated circuit of claim 16,
 further including voltage regulator means for providing said Vref reference voltage to each said Vreg reference port, comprising:
 third and fourth transistors coupled between said upper rail voltage and said lower rail voltage, each said third and fourth transistor having an emitter coupled to a common reference emitter node;
  a chosen one of said third and fourth transistors having an input lead coupled to receive a DC logic "1" voltage level, the unchosen one of said third and fourth transistors having an input lead coupled to receive a DC threshold voltage level intermediate to a logic "1" and a logic "0" level;
 a fifth transistor having an input lead coupled to receive an inverted input signal from said third transistor, having a first output lead coupled to said upper rail voltage and having a second output lead resistively coupled to an output lead of said fourth transistor;
 a sixth transistor having an input lead coupled to said first output lead of said fourth transistor, having a first output lead coupled to said second output lead of said fifth transistor, and having a second output lead functioning as a regulated voltage output port;
 current means for providing first and second current sinking paths, said first sinking path coupled between said common reference emitter node and said lower rail voltage, and said second sinking path coupled between said voltage regulated output port and said lower rail voltage, said first sinking path sinking output current through one of said third or said fourth transistor to said lower rail voltage and said second sinking path sinking current from said sixth transistor to said lower rail voltage;
 wherein said voltage regulator means creates a voltage bias at said voltage regulated output port that is a desired said Vreg reference potential at a desired crossover current bias level; and
 feedback means for comparing a potential present at said Vreg port in said DC-coupled switching circuit with said voltage bias present at said voltage regulated output port, and for forcing said potential at each said Vreg reference port to be substantially equal to said voltage bias at said voltage regulated output port.

20. The integrated circuit of claim 19, wherein said feedback means includes a differential amplifier, having a first input coupled to said regulated voltage output port of said sixth transistor, having a second input coupled to said Vreg reference port, and providing an output signal proportional to a difference between signals present at said first and said second input, and a current mirroring circuit coupled between said upper rail voltage and said lower rail voltage, said current mirror circuit having an input port coupled to said output signal from said differential amplifier, and further having a node whereat a Vreg voltage coupled to said Vreg reference port is present, wherein said crossover current bias level in said voltage regulator means is imposed on each said ECL switching circuit.

21. The integrated circuit of claim 20, further including at least one current source transistor, coupled between said Vreg port on each said circuit and said lower rail voltage, and receiving a reference bias voltage from said voltage regulator means;

said at least one current source transistor being disposed at a location selected from the group consisting of (i) adjacent said voltage regulator means, and (ii) adjacent said ECL switching circuit.

22. A method of actively pulling-down the signal output node of an emitter-coupled logic ("ECL") circuit that includes first and second transistors that each have an emitter coupled to a common emitter node, said first and second transistors being coupled between an upper rail voltage and a current source coupled between said common emitter node and a lower rail voltage, and that further includes a pull-up transistor coupled between the upper voltage rail and resistively coupled to the collector of said second transistor, an emitter lead of said pull-up transistor emitter providing a signal output node for the ECL circuit, the method comprising the following steps:

(a) coupling to said circuit a pull-down transistor having a base coupled to said collector of said second transistor, a collector coupled to said signal output node, and an emitter coupled to a Vreg reference voltage;

(b) providing to said emitter of said pull-down transistor a Vreg reference voltage whose magnitude causes said pull-down transistor to turn-on when a signal at said signal output node transitions from logic state "1" to logic state "0" and then to self-terminate and remain biased in a near on state;

wherein operation of said pull-down transistor self-adjusts to a load, coupled to said signal output port, affecting transition time of a logic state "1" to logic state "0" output node transition.

23. The method of claim 22, wherein step (b) includes providing said Vreg reference voltage with a regulator circuit that is referenced to said upper voltage rail and that sinks current in said pull-down transistor.

24. The method of claim 22, wherein step (b) includes establishing a desired Vreg voltage level at a desired crossover current bias level; and feedback means for comparing said desired Vreg voltage level with a said Vreg reference voltage and for driving said voltage at said emitter of said pull-down transistor to match said desired Vreg voltage level.

25. The method of claim 24, wherein at said step (b), said feedback means includes a differential amplifier, having a first input coupled to said desired Vreg voltage level, having a second input coupled to said emitter of said pull-down transistor, and providing an output signal proportional to a difference between signals present at said first and said second input, and a current mirroring circuit coupled between said upper rail voltage and said lower rail voltage, said current mirror circuit having an input port coupled to said output signal from said differential amplifier, and further having a node whereat said desired Vreg voltage level is present, wherein said crossover current bias level in said voltage regulator means is imposed on said ECL circuit.

* * * * *